United States Patent [19]
Tien et al.

[11] Patent Number: 5,923,613
[45] Date of Patent: Jul. 13, 1999

[54] LATCHED TYPE CLOCK SYNCHRONIZER WITH ADDITIONAL 180°-PHASE SHIFT CLOCK

[75] Inventors: Li-Chin Tien, Taipei; Gyh-Bin Wang, Chung-Li, both of Taiwan

[73] Assignee: Etron Technology, Inc., Hsin-Chu, Taiwan

[21] Appl. No.: 09/040,435

[22] Filed: Mar. 18, 1998

[51] Int. Cl.[6] ................................................. G11C 8/00
[52] U.S. Cl. ..................... 365/233; 365/194; 395/555; 395/556; 327/261; 327/295
[58] Field of Search .................. 365/233, 230.08, 365/189.05, 194; 327/261, 291, 295; 395/555, 556, 552

[56] References Cited

U.S. PATENT DOCUMENTS

| | | | |
|---|---|---|---|
| 5,065,041 | 11/1991 | Moles | 327/295 |
| 5,479,128 | 12/1995 | Jan et al. | 327/261 |
| 5,489,864 | 2/1996 | Ashuri | 327/161 |
| 5,663,767 | 9/1997 | Rumreich et al. | 348/537 |
| 5,663,921 | 9/1997 | Pascucci et al. | 365/194 |
| 5,761,151 | 6/1998 | Hatakeyama | 365/194 |
| 5,841,707 | 11/1998 | Cline et al. | 365/194 |
| 5,867,432 | 2/1999 | Toda | 365/194 |

OTHER PUBLICATIONS

T. Saeki et al. "A 2.5ns Clock Access 250 mhz.256mb SPRAM With Synchronous Mirror Delay", IEEE Journal of Solid State Circuits, vol. 31, No. 11, Nov. 1996, pp. 1656–1664.

T. Yamada et al. Capacitive Coupled Bus With Negative Delay Circuit For High Speed and Low Power (10GB/s<500mW) Synchronous DRAM> Digest of Papers for IEEE Symposium on VLSI Circuits, 1996, pp. 112–113.

*Primary Examiner*—Tan T. Nguyen
*Attorney, Agent, or Firm*—George O. Saile; Stephen B. Ackerman; Billy J. Knowles

[57] ABSTRACT

A multiple phase latched type synchronized clock circuit that will create a multiple phases of an internal clock signal in an integrated circuit that is synchronized with an external system clock signal is disclosed. A latched type clock synchronizer circuit has an input buffer circuit to receive the external input clock to create a first timing clock. The input buffer is connected to a delay monitor circuit to delay the first timing clock by a first delay factor to create a second timing clock. A delay measurement latch array is connected to the input buffer circuit and the delay monitor circuit to create a latched measurement signal, which indicates a period of time between a second pulse of the first timing clock and a first pulse of the second timing clock. A multiple delay array is connected to the input buffer to receive the first timing clock and will create multiple pluralities of incrementally delayed timing clocks. The multiple pluralities of incrementally delay timing clocks and the latched measurement signal are the inputs to a plurality of phase generators that create a plurality of third timing clocks. Each of a plurality of internal buffers is connected to each of the phase generators to receive one of the third timing clocks. The third timing clock is shaped to create one of the multiple phases of the internal clocks which are then buffered, amplified and transmitted to the integrated circuit.

11 Claims, 10 Drawing Sheets

LATCHED TYPE CLOCK SYNCHRONIZER WITH ADDITIONAL 180°-PHASE SHIFT CLOCK

RELATED PATENT APPLICATIONS

ETRON97-004, A Synchronous Race Delay Circuit For Clock Skew Minimization And Frequency Doubling, Ser. No. 09/035,033, Filing Date: Mar. 5, 1998, Assigned to the Same Assignee as the present invention.

BACKGROUND OF THE INVENTION

1. Field of the Invention

This invention relates to circuitry for the distribution of clock timing signals within integrated circuits and more particularly to clock timing signal distribution circuitry within integrated circuits such as synchronous dynamic random access memories (SDRAM) that must provide multiple clock phases with minimal skew in relation to an external system clock.

2. Description of Related Art

Figure 1:
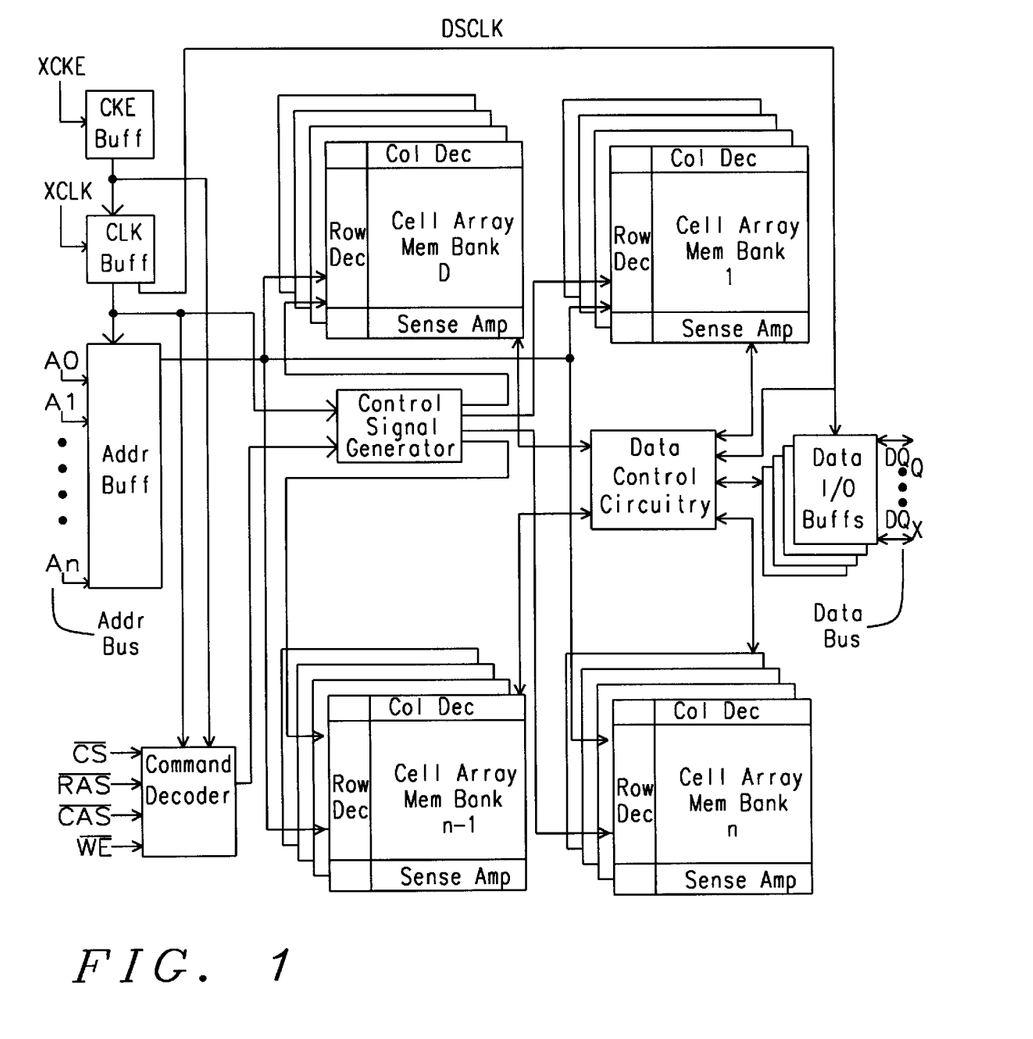
FIG. 1 is a block diagram of an SDRAM.

As shown in FIG. 1 and is well known in the art, an SDRAM will have multiple cell arrays within multiple memory banks to retain digital data. The system Address Bus $A_0, A_1, \ldots, A_n$ will be connected to the Address Buffer to receive the address of the location of the retained digital data within the multiple cell arrays of the multiple memory banks. The Address Buffer will transfer the requested address to the appropriate cell array within a selected memory bank, where the row and column address decoders will select the appropriate location of the digital data.

The chip select $\overline{CS}$, the row address strobe $\overline{RAS}$, column address strobe $\overline{CAS}$, and the write enable $\overline{WE}$ signals will form a command bus and will be received by the command decoder. These signals will be decoded and transferred to the control signal generator. The control signal generator will generate and transfer a set of control signals that will determine the operation modes of the selected cell array in the one memory bank. These modes will be variations and combinations of fetching or reading from, storing or writing to, or refreshing of the digital data within the cell arrays of the memory banks.

The data control circuitry will receive data from the data input/output buffers which in turn are connected to a system data bus to receive and transmit the digital data $DQ_0, \ldots, Dq_x$ to and from the cell arrays within the memory banks.

The external system clock XCLK will be transferred to the clock buffer. The clock buffer will then transfer the clock to the other operating units of the SDRAM. The clock that controls the timings of the data control circuitry must be such that the digital data $DQ_0, \ldots, Dq_x$ will be appropriately aligned with the external system clock XCLK.

During periods of inactivity for an SDRAM, it is desirable that the SDRAM be deactivated. This will be controlled by the clock enable signal XCKE.

The structure and timing of the clock distribution within the SDRAM is described in "A 2.5 ns Clock Access 250 Mhz, 256 Mb SDRAM with Synchronous Mirror Delay" by T. Saeki et al, IEEE Journal of Solid State Circuits, Vol 31 No. 11 November 1996, pp 1656–1664, and shown in FIGS. 2a and 2b. The external system clock XCLK is received by the input buffer IBUF. The input buffer IBUF has a delay time from the input of the external system clock XCLK to the output of the input buffer IBUF that is designated d1. The output of the input buffer IBUF is the input to multiple internal buffers INTBUF. The internal buffers INTBUF will then transfer the internal clock ICLK to the functional units within the SDRAM. The delay time for the internal buffer INTBUF is designated d2.

Figure 2A:
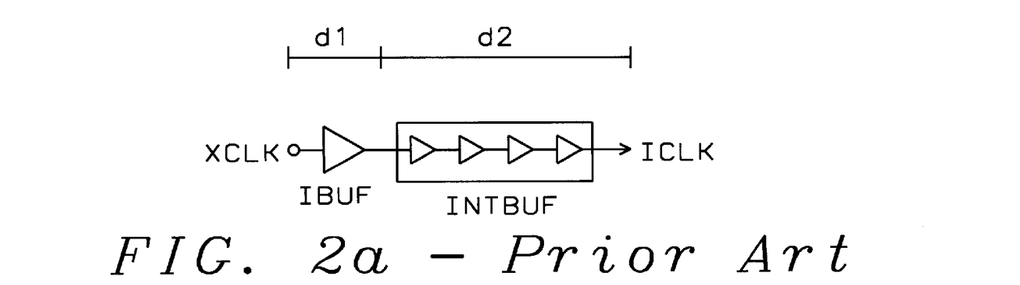
FIG. 2a is a schematic diagram of a clock distribution circuit of an SDRAM of the prior art
Figure 2B:
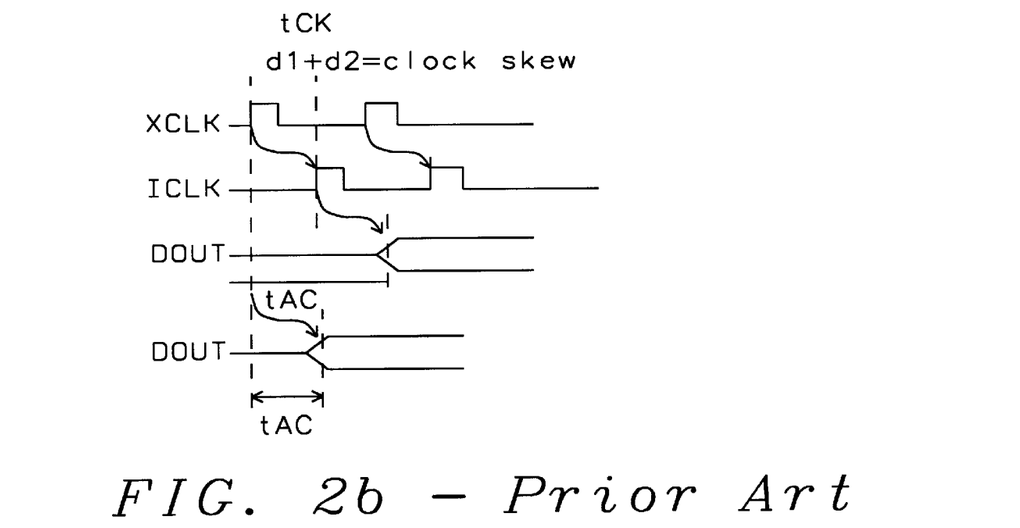
FIG. 2b is timing diagram showing the effects of the clock skew of the clock distribution circuit of the prior art.

The command signals chip select $\overline{CS}$, the row address strobe $\overline{RAS}$, column address strobe $\overline{CAS}$, and the write enable $\overline{WE}$, as well as the address bus $A_0, A_1, \ldots, A_n$ will be gated into the SDRAM during the rise of the internal clock ICLK from a first logic level (0) to a second logic level (1). The internal clock ICLK will be the timing signal that is used to synchronize the transfer of the digital data from the cell array in the memory banks to the data input/output buffers and to the data bus $DQ_0, \ldots, Dq_x$. The internal clock ICLK will be delayed or skewed by the delay d1 of the input buffer IBUF plus the internal buffer INTBUF. Since the timing of the functions of the SDRAM are determined by the internal clock ICLK, the access time $T_{acc}$ of the fetching or reading of the digital data can be no smaller than the clock skew d1+d2 plus the period of the internal clock ICLK. This forces the minimum time that data can be cycled from the SDRAM to be two external system clock XCLK periods. As computer system clocks are approaching transfer rates of 100 Mhz, it is desirable that the access time $T_{acc}$ of an SDRAM to be brought to one cycle of the external system clock XCLK. This means that the clock skew d1+d2 must be eliminated from the clock distribution system.

Phase Locked Loops (PLL) and Delay Locked Loops (DLL) are well known in the art for synchronizing two timing signals. In both cases the time to achieve synchronization or lock may be on the order of 50 cycles or more. With such long lock times in SDRAM applications, the internal clocking signals ICLK can not be deactivated during the periods that the SDRAM is inactive. This will increase the power dissipation of the SDRAM to undesirable levels.

The Clock Synchronization Delay (CSD) is a class of synchronizing circuits that will eliminate the clock skew d1+d2 within two clock cycles. two types of CSD's known in the art are the latched type CSD and the nonlatched synchronous mirror delay SMD.

Figure 3A:
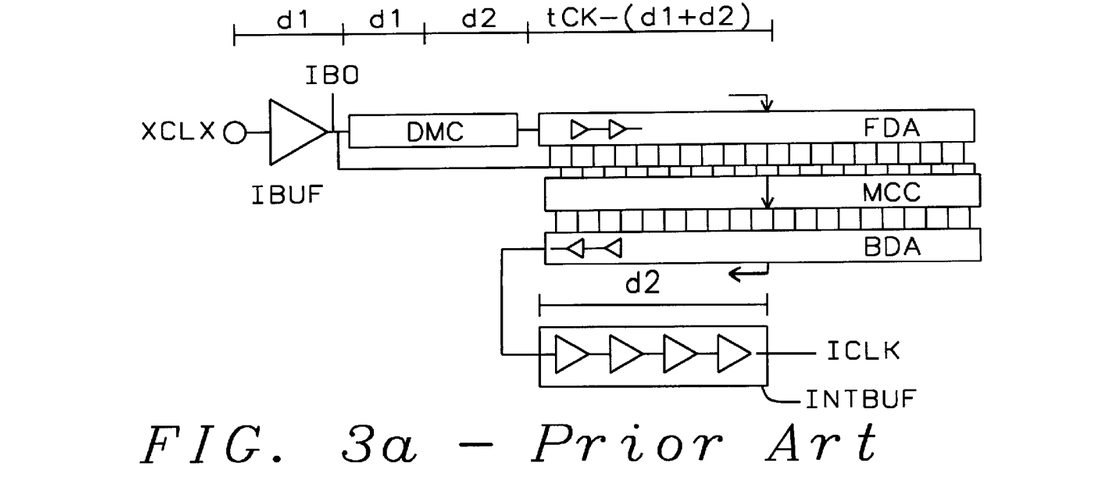
FIG. 3a is a schematic diagram of a clock synchronous delay circuit of the prior art.
Figure 3B:
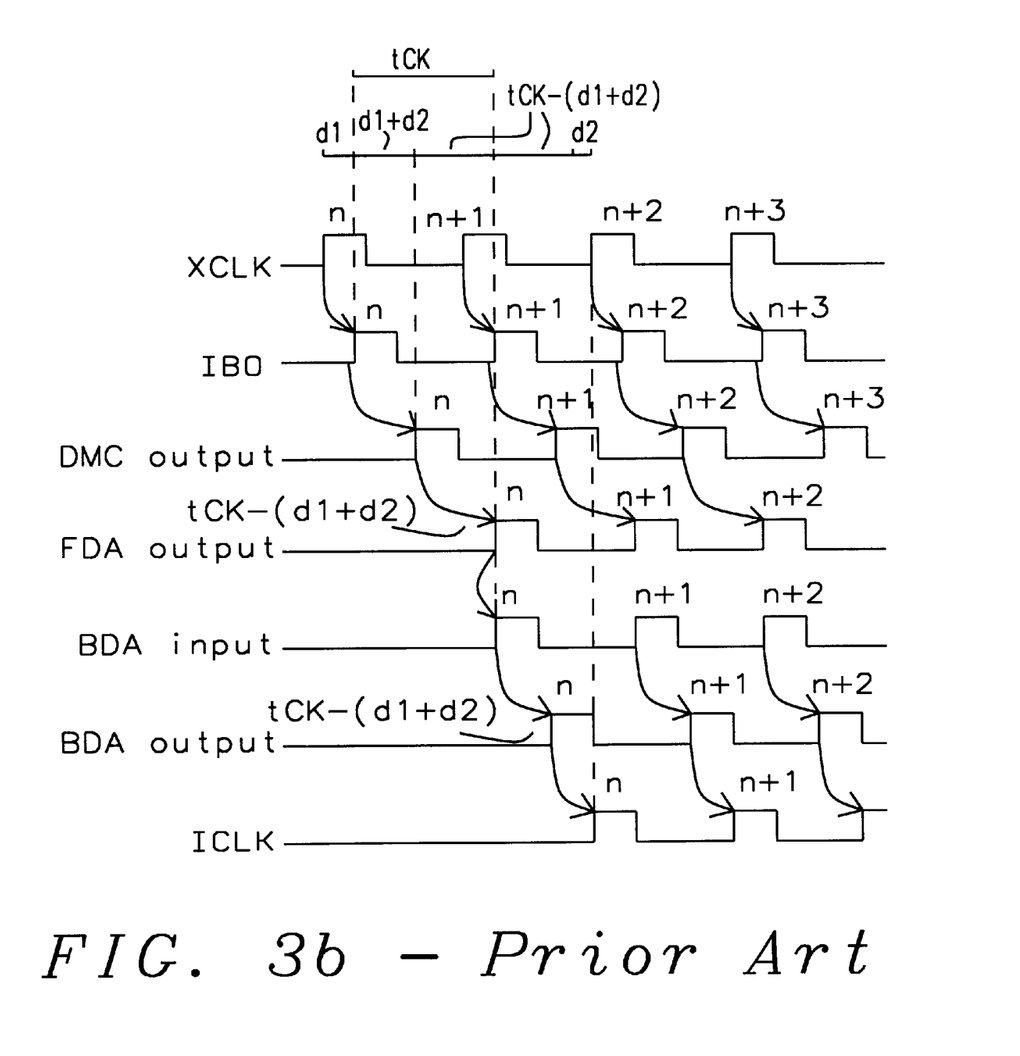
FIG. 3b is a timing diagram of a clock synchronous delay circuit of the prior art.

FIGS. 3a and 3b show a schematic diagram and a timing diagram for the general structure of a CSD circuit. As in FIG. 2a, the external system clock XCLK is received by the input buffer IBUF. The output IBO of the input buffer IBUF is delayed by the delay d1. The output IBO of the input buffer IBUF is the input to the delay monitor circuit DMC. The delay monitor circuit DMC will provide an output that is a delayed input signal IBO by a fixed amount that is usually the sum of the delay d1 of the input buffer IBUF and the delay d2 of the internal buffer INTBUF.

The output of the delay monitor circuit DMC will be the input of the forward delay array FDA. The forward delay array FDA comprises a number of delay elements that will each delay the input of the forward delay array FDA by an increment of time $t_{df}$. The output of each delay element of the forward delay array FDA is the input for each subsequent delay element and is also one of the multiple outputs of the forward delay array FDA.

The multiple outputs of the forward delay array FDA are inputs to the mirror control circuit MCC. The output IBO of the input buffer circuit IBUF is also provided to multiple inputs of the mirror control circuit MCC. The output IBO of the input buffer circuit IBUF is compared with each output of the forward delay array FDA. When one of the outputs of the forward delay array FDA is aligned with the n+1 pulse of the output IBO of the input buffer IBUF, the mirror control circuit will transfer that one output to the backward delay array BDA. The mirror control circuit MCC will have multiple outputs to transfer any one of the inputs of the mirror control circuit MCC from the forward delay array FDA to the backward delay array BDA. The backward delay array BDA is comprised of multiple delay elements. Each delay element has a delay time $t_{df}$ equal to the delay time of the forward delay array FDA.

The delayed clock pulse will be delayed by a factor of:

$$\tau_{FDA} = \tau_{ck} - (d_1 + d_2)$$

where $\tau_{ck}$ is the time of the period of the external clock.

$\tau_{FDA}$ is the time of the period of the external clock less the skew $d_1 + d_2$.

The delayed clock pulse will be further delayed by the factor $\tau_{FDA}$ in the backward delay array BDA. thus the nth pulse output of the backward delay array BDA will be delayed by a factor of $$2d_1 + d_2 + 2(\tau_{ck} - d_1 + d_2)$$

This will make the nth pulse of the backward delay array BDA misaligned with the n+2 pulse of the external system clock XCLK by a factor of the delay $d_2$ of the internal buffer INTBUF.

The output of the backward delay array BDA will be the input of the internal buffer INTBUF. The nth internal clock ICLK will now be aligned with the system clock XCLK.

If the system clock CLK is disabled by the clock enable CLKE of FIG. 1 and the re-enabled, it will require only two system clock cycles for the internal clock ICLK to align with the system clock XCLK. Thus any data can be accessed within a single period $\tau_{ck}$ of the system clock XCLK.

The mirror control circuit MCC will be of two types. The first type as described in "Capacitive Coupled Bus with Negative Delay Circuit for High Speed and Low Power (10 GB/s<500 mw) Synchronous DRAM) by T. Yamada et al, Digest of Papers for IEEE Symposium on VLSI Circuits; 1996, pp 112–113, will be a latch that will fix the delay segment of the forward delay element FDA selected to be transferred to the backward delay array BDA. Once the latch is set, it will only be reset during the inactivity time of the SDRAM. Upon reactivation of the SDRAM, the decision of the length of the delay necessary will be recreated.

The second type of mirror control circuit MCC will be the synchronous mirror delay. The mirror control circuit MCC will be a pass gate that is activated when the output of the forward delay circuit FDA is aligned with the n+1 pulse of the output IBO of the input buffer circuit IBUF. The synchronous mirror delay will chose on each cycle of the system clock XCLK, which of the delay elements is satisfactory to align with the output IBO of the input buffer circuit IBUF.

As the system timing requirements of modern computers has increased, it is now necessary to double the frequency of transfer of data from SDRAM, that is to transfer data from the data bus to the system twice every clock cycle.

A new class of SDRAM is referred to as a Double Data Rate (DDR) SDRAM. The specification of the DDR SDRAM does not specify that the external system clock XCLK have a precise 50% duty cycle. However, it must have the first data present at the Data Input/Output Buffers at the beginning of a clock cycle, that is when the external system clock XCLK rises from the first logic level (0) to the second logic level (1). The second data must be present at the Data Input/Output Buffers at the time that is one half of the period of the system clock $\tau_{ck}$ or to be 180° out of phase with the system clock XCLK.

This creates a requirement for a dual phase clock having a precise 50% duty cycle. The dual phase clock must be deskewed with respect to the external system clock XCLK in the two cycles from the clock enable signal XCKE.

U.S. Pat. No. 5,663,767 (Rumreich et al.) describes a clock retiming apparatus for aligning a video clock edge with horizontal synchronization signal of a video signal by using latched outputs of delay lines. The outputs of the delay lines are selected according to their alignment with the horizontal synchronization signal.

U.S. Pat. No. 5,489,864 (Ashuri) discloses an integrated circuit for deskewing and adjusting a delay of a synthesized waveform. The synthesized waveform is initially produced by a digital-to-time domain converter which is coupled to a synchronous delay line and a pattern ROM though a shifter and pattern register. The synchronous delay line generates a plurality of taps in response to a reference signal. Each one of the taps has a unit delay and is coupled to the digital to time domain converter. The integrated circuit described comprises a microdelay calibration circuit, deskew control circuit, and a delay interpolation circuit. The microdelay calibration circuit is coupled to the synchronous delay line and the deskew control circuit. The deskew control circuit is further coupled to the shifter and the delay interpolation circuit. The delay interpolation circuit receives the output of the digital-to-time domain converter and outputs a deskewed synthesized waveform.

SUMMARY OF THE INVENTION

An object of this invention is to provide an internal clock circuit in an integrated circuit that will create an internal clock signal that is synchronized with from an external system clock signal.

Another object of this invention is to provide an internal clock circuit within an integrated circuit that will provide multiple clock signals that are synchronized to an external clock signal.

To accomplish these and other objects a latched type clock synchronizer circuit has an input buffer circuit to receive, buffer, and amplify the external input clock to create a first timing clock. The input buffer is connected to a a delay monitor circuit to delay the first timing clock by a first delay factor to create a second timing clock.

A delay measurement latch array is connected to the input buffer circuit and the delay monitor circuit to create a latched measurement signal. The latched measurement signal indicates a period of time between a second pulse of the first timing clock and a first pulse of the second timing clock.

A multiple delay array is connected to the input buffer to receive the first timing signal. The multiple delay array will create multiple pluralities of incrementally delayed timing clocks. The multiple pluralities of incrementally delay timing clocks are the inputs to a plurality of phase generators. The plurality of phase generators will create a plurality of third timing clocks. Each phase generator will also receive the latched measurement signal. Each phase generator will logically combine the multiple pluralities of incrementally delay timing clocks and the latched measurement signal to select one of the incrementally delayed timing clocks to create each of the third timing clocks.

Each of a plurality of internal buffers is connected to each of the phase generators to receive one of the third timing clocks. Each of the internal buffers will shape the third timing clock to create one of the multiple phases of the internal clocks and then buffer, amplify and transmit the phase of the internal clock to the integrated circuit. Each internal buffer will have a second delay time to synchronize the phase with the external system clock.

DETAILED DESCRIPTION OF THE INVENTION

Figure 4:
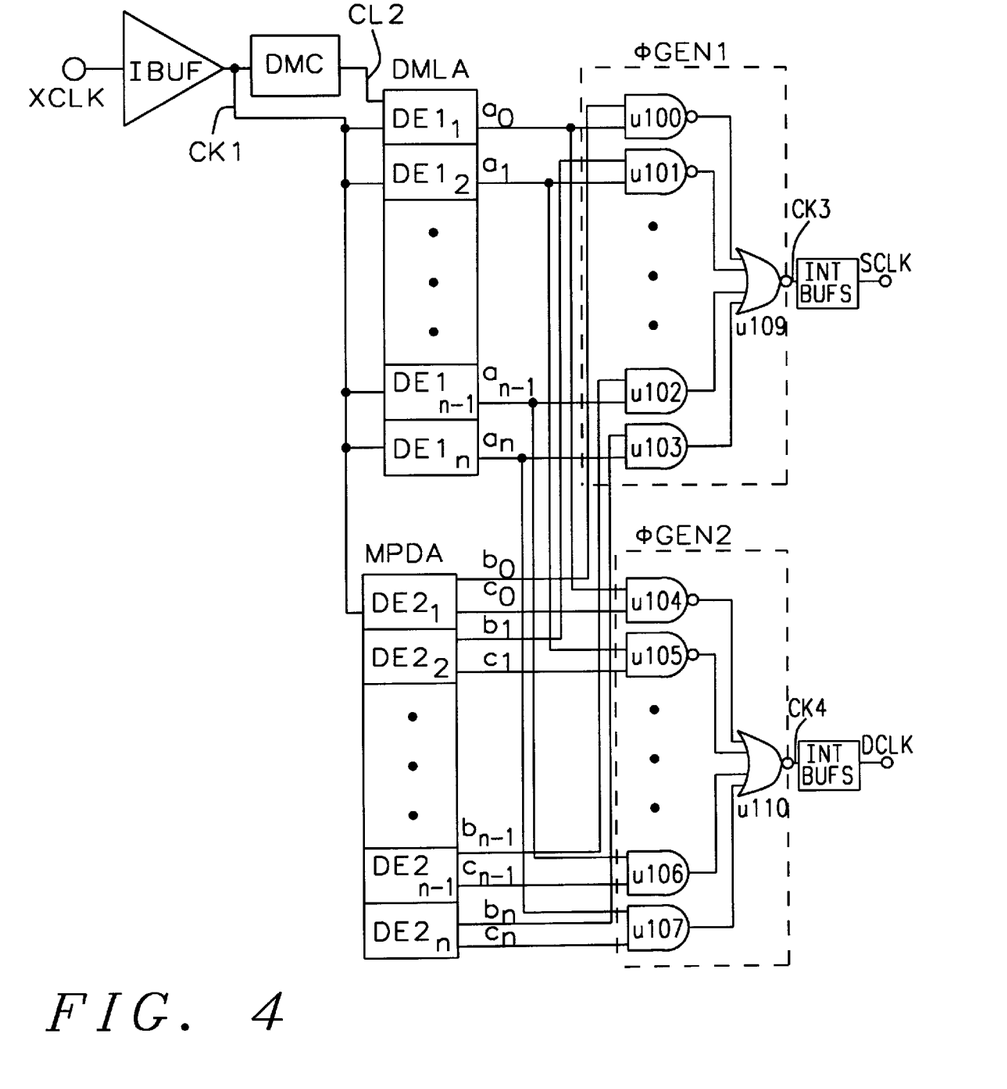
FIG. 4 is block diagram of a latched type clock synchronizer circuit of this invention.

To understand the structure and operation of a multiple phase latched type clock synchronizer circuit of this invention, refer now to FIG. 4. The external clock XCLK is the input to the input buffer IBUF. The input buffer IBUF will receive, buffer and amplify the external clock XCLK to create the first timing clock CK1. The delay of the input buffer is designated as the delay factor d1.

Figure 5:
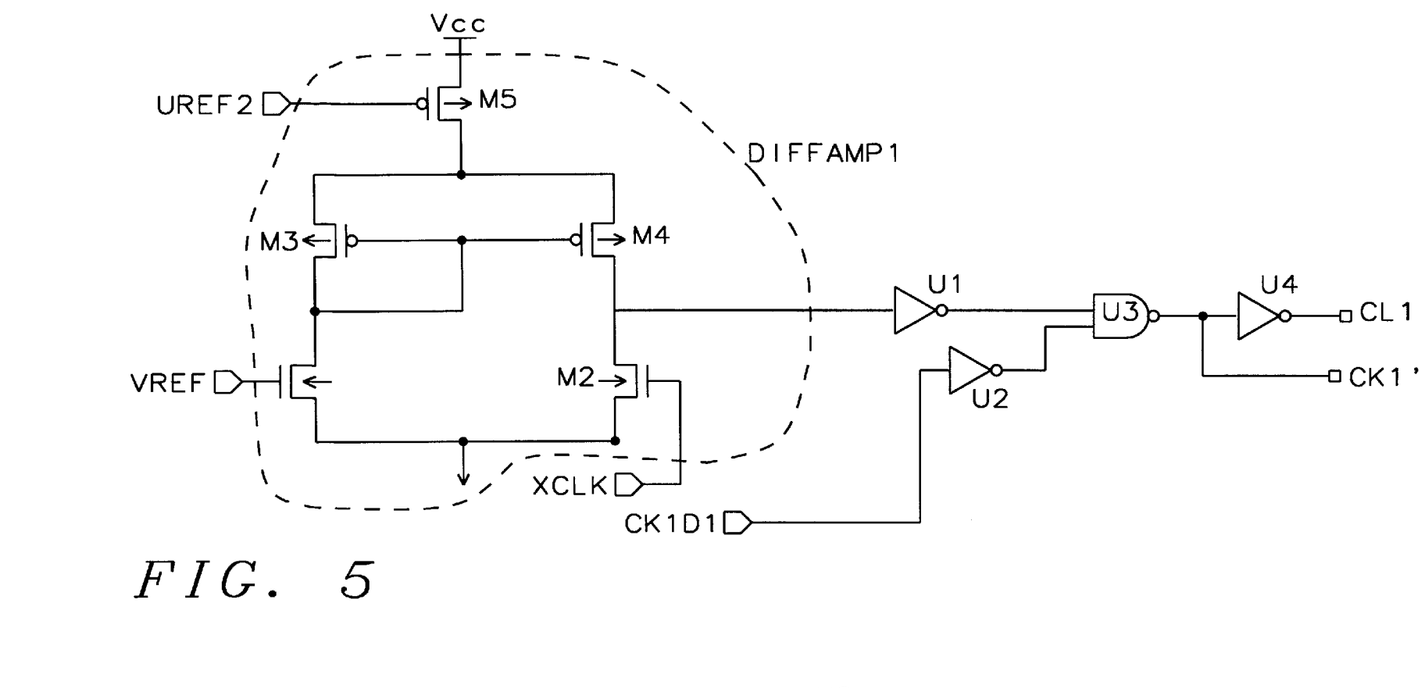
FIG. 5 is a schematic diagram of an input buffer of a latched type clock synchronizer circuit of this invention.

Refer now to FIG. 5 for a description of the input buffer IBUF. The metal oxide semiconductor (MOS) transistors $M_1$, $M_2$, $M_3$, $M_4$, and $M_5$ form a differential amplifier DIFFAMP1. The gate of MOS transistor $M_1$ is connected to a reference voltage source $V_{ref}$ to determine a threshold voltage level for the external clock XCLK. The external clock XCLK will be attached to the gate of the MOS transistor $M_2$. The voltage reference VREF2 will be connected to the gate of the MOS transistor $M_5$. The voltage reference VREF2 will activate the differential amplifier DIFFAMP2 when it is biased to a voltage sufficient to activate the MOS transistor $M_5$. The MOS transistors $M_3$ and $M_4$ will act as an active load current source for the differential pair of transistors $M_1$ and $M_2$. The output of the differential amplifier DIFFAMP1 is the input to the inverter u1. The output of the inverter u1 is the first input of the NAND gate u3.

The second input of the NAND gate u3 is the output of the inverter u2. The input of the inverter is the delay clock signal CK1D1. The delay dock signal CK1D1 will fix the pulse width of the received clock that is the output of the NAND gate u3 to the delay factor d1 of the input buffer IBUF plus the delay of the inverter u2. The output of the NAND gate u3 is the inverted form CK1' of the first timing clock CK1. The output of the NAND gate u3 is the input of the inverter u4. The output of the inverter u4 is the first timing clock CK1.

Returning back to FIG. 4, the first timing clock CK1 is the input to the delay monitor circuit DMC. The delay monitor circuit DMC will provide a fixed delay that will be a multiple of the delay factor d1 and the delay factor d2. The delay factor d2 is generally the fundamental delay of the internal buffer circuit INTBUF.

Figure 6:
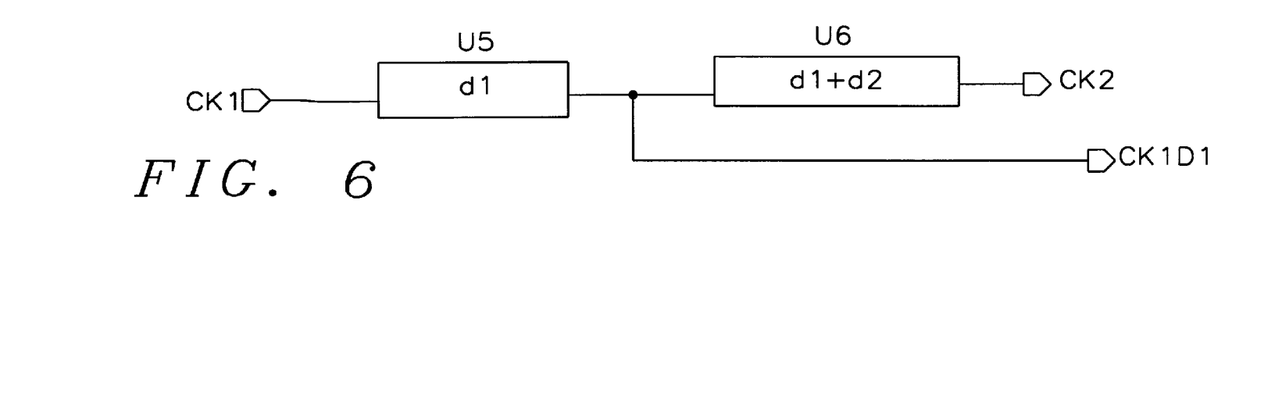
FIG. 6 is a schematic diagram a delay monitor circuit of a latched type clock synchronizer circuit of this invention.
Figure 7:
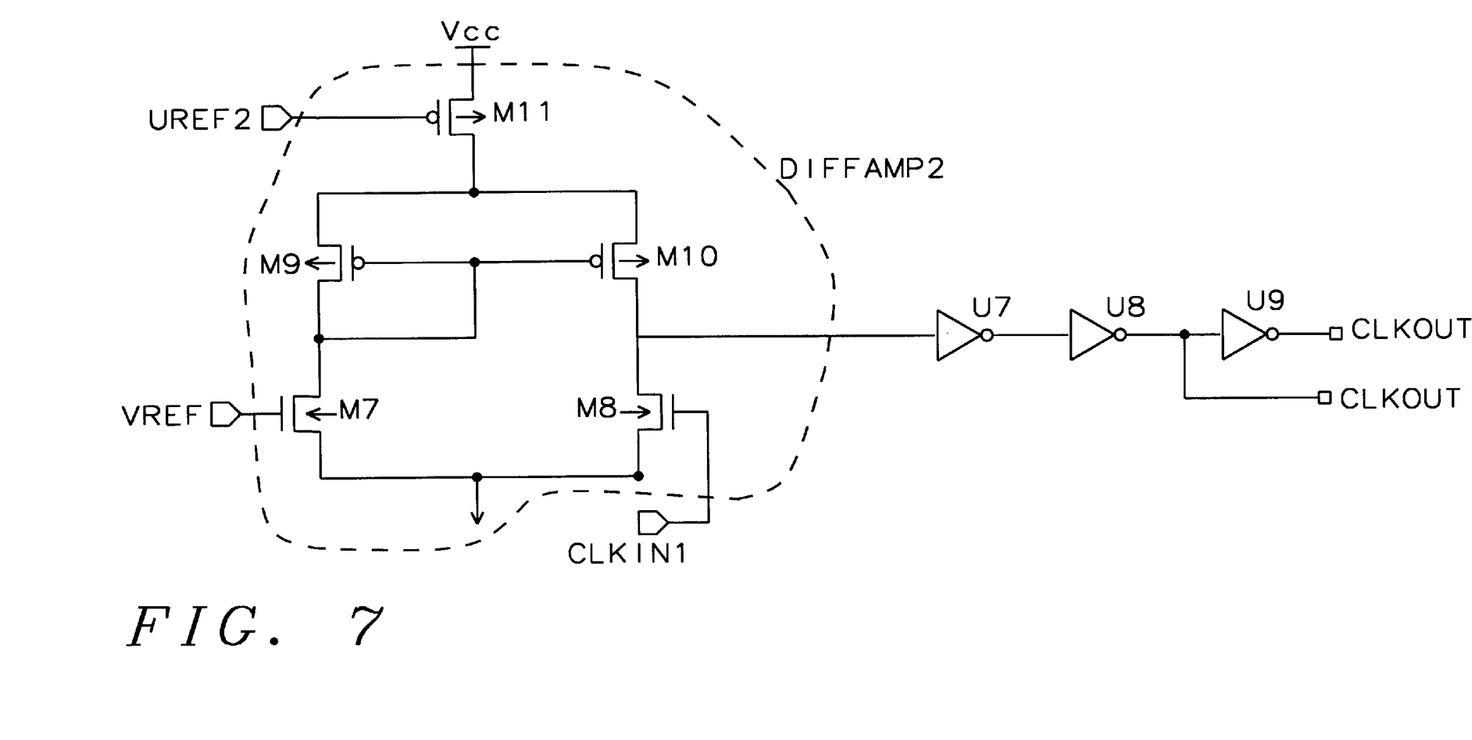
FIG. 7 is a schematic diagram of a first delay block of a latched type clock synchronizer circuit of this invention.

The delay monitor circuit DMC has, as shown in FIG. 6, a delay block u5. The delay block u5, as shown in FIG. 7, will delay the first timing clock CK1 by the delay factor d1. The differential amplifier DIFFAMP2 is comprised of the MOS transistors $M_7$, $M_8$, $M_9$, $M_{10}$, and $M_{11}$. The MOS transistors $M_7$, and $M_8$ form a differential pair. The reference voltage source Vref is connected to the gate of the MOS transistor $M_7$. The reference voltage source Vref will establish the threshold voltage for the clock input CLKin that is connected to the gate of the MOS transistor $M_8$.

The MOS transistors $M_9$ and $M_{10}$ act as an active load current source to develop the signal that is the input to the inverter u7. The voltage reference VREF2 is connected to the gates of the MOS transistors $M_{11}$. The voltage reference VREF2 will activate the differential amplifier DIFFAMP2 when it is biased to a voltage level sufficient to turn on the MOS transistor $M_{11}$.

The output of the differential amplifier DIFFAMP2 is the input of the chain of inverters u7, u8, and u9. The chain of inverters u7, u8, and u9 will have delays that will make the cumulative delay from the input clock CLKin to the output clock CLKout equal to the delay factor d1.

Returning now to FIG. 6, the output CK1D1 of first delay block is the input of the inverter u2 of FIG. 5 and determines the pulse width of the first timing clock CK1. The output CK1D1 is the input of the delay block u6. The delay block u6 has a delay that is the sum of the delay factor d1 and the delay factor d2.

Figure 8:
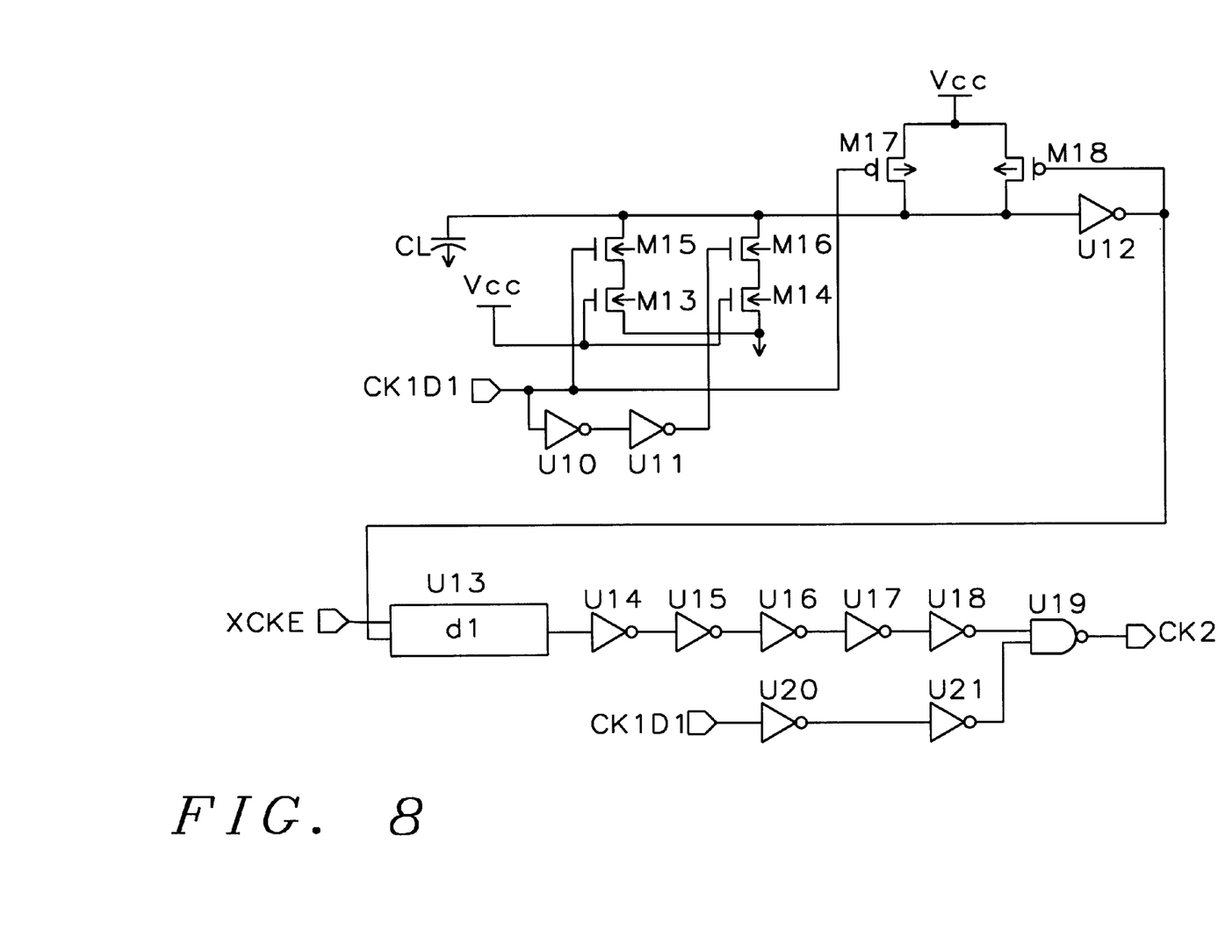
FIG. 8 is a schematic diagram of a second delay block of a latched type clock synchronizer circuit of this invention.

Refer to FIG. 8 for an implementation of the delay block u6. The input clock CK1D1 of the delay block u6 is connected to the input of the inverter u10 and the gates of the MOS transistors $M_{15}$ and $M_{16}$. The MOS transistors $M_{13}$, $M_{14}$, $M_{15}$, $M_{16}$, $M_{17}$, and $M_{18}$, and the loading capacitor $C_L$ will equalize the loading of the delay block u6 such that delay from the input clock CK1D1 to the output clock CK2 is equal to the delay from the third timing clock CK3 to the first phase of the internal clock SCLK of FIG. 4.

The output of the inverter u12 is the input of the delay block u13. The delay block u13 is the same circuit as shown in FIG. 7 and will delay the signal at the input by the delay factor d1. The inverter chain u14, u15, u16, u17, and u18 will delay and invert the signal from the delay block u13. The output of the inverter chain u14, u15, u16, u17, and u18 is the first input to the NAND gate u19.

The input clock CK1D1 is buffered by the inverters u20 and u21 and is the second input to the NAND gate u19. The output of the NAND gate u19 is the second timing clock CK2.

The delay block u5 and the delay block u6 will emulate precisely the delay d1 of the input buffer and the loading and delay d2 of the internal buffers INTBUFS and INTBUFD.

Refer now back to FIG. 4. The delay measurement latch array DMLA has multiple serially connected latched delay elements $DE1_1$, $DE1_2$, ..., $DE1_{n-1}$, $DE1_n$. The first timing signal CK1 is connected to each of latched delay elements $DE1_1$, $DE1_2$, ..., $DE1_{n-1}$, $DE1_n$. The second timing signal CK2 is connected to the first latched delay element $DE1_1$. Each latched delay elements $DE1_1$, $DE1_2$, ..., $DE1_{n-1}$, $DE1_n$ has a latched measurement signal output $a_0$, $a_2$, ..., $a_{n-1}$, $a_n$. The second timing clock CK2 will be delayed by a delay factor for each latched delay elements $DE1_1$, $DE1_2$, ..., $DE1_{n-1}$, $DE1_n$. As the second timing clock CK2 is delayed, the first pulse and each succeeding pulse of the second timing clock CK2 will eventually become aligned with the second pulse and each succeeding pulse of the first timing clock CK1. The latched delay elements $DE1_1$, $DE1_2$, ..., $DE1_{n-1}$, $DE1_n$. At which the alignment occurs will activate the latched measurement signal $a_0$, $a_2$, ..., $a_{n-1}$, $a_n$ that indicates the time difference $\tau_1$ of the period $\tau_{ck}$ of the external clock and the cumulative delay factors of the input buffer IBUF and the delay monitor circuit DMC. The time difference will be:

$$\tau_1 = \tau_{ck} - 3d1 + d2$$

Figure 9:
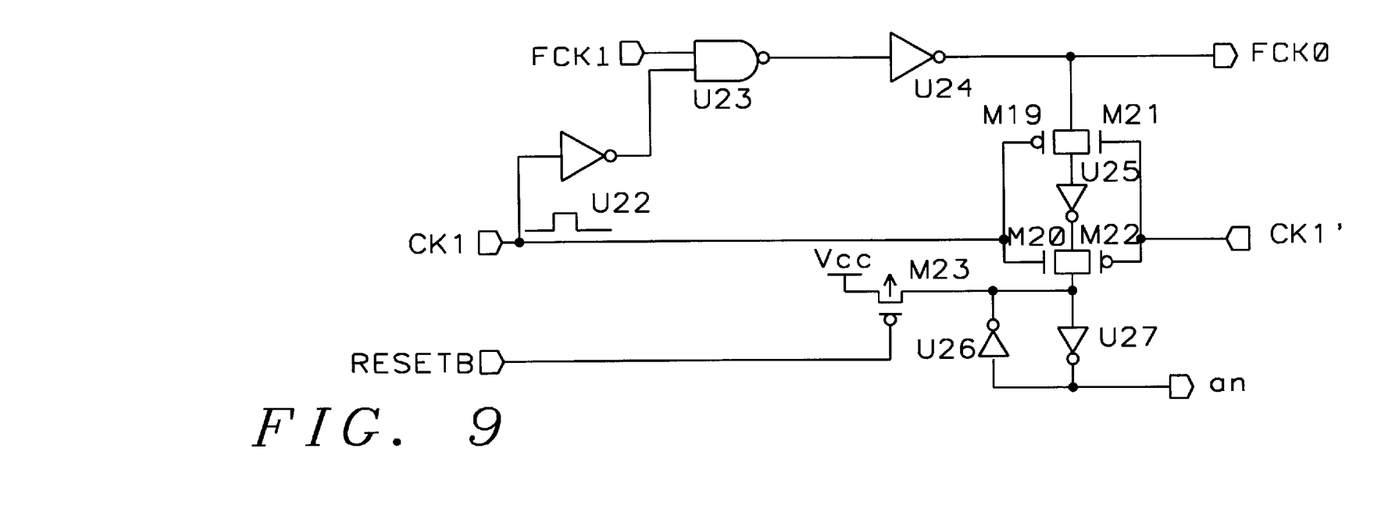
FIG. 9 is a schematic diagram of a latched delay element of a latched type clock synchronizer circuit of this invention.

Refer now to FIG. 9 for an embodiment of the latched delay element of this invention. The input clock CK1 form the input buffer IBUF of FIG. 4 is connected to the inverter u22 and the MOS transistors sources of the MOS transistors $M_{19}$ and $M_{20}$. The out of phase form the input clock CK1' from the output of the NAND gate u3 of FIG. 5 is connected to the gates of the MOS transistors $M_{21}$ and $M_{22}$. The first input of the NAND gate u23 is connected to the output of the inverter u22. The input delay clock FCKI is connected to the output of delay clock FCKO of the preceding latch delay element $DE1_1$, $DE1_2$, ..., $DE1_{n-1}$, $DE1_n$ of FIG. 4. The first latched delay element $DE1_1$, of FIG. 4 will have its input clock connected to the second timing clock CK2 of FIG. 4.

The output of the NAND gate u23 is connected to the inverter u24. The output of the inverter u24. is the output delay clock FCKO, and is attached to the input of the pass gate formed by the MOS transistors $M_{19}$ and $M_{21}$. The output of the pass gate formed by the MOS transistors $M_{19}$ and $M_{21}$ is the input to the inverter u25. The output of the inverter u25 is the input to the pass gate formed by the MOS transistors $M_{20}$ and $M_{22}$. The output of the pass gate formed by the MOS transistors $M_{20}$ and $M_{22}$ will form the set signal for the latch formed by the inverters u26 and u27.

The reset signal is attached to the gate of the MOS transistor $M_{23}$. The source of the MOS transistor $M_{23}$ is connected to the power supply voltage source $V_{cc}$. The drain of the MOS transistor $M_{23}$ is connected to input of the latch formed by the inverters u26 and u27 to form a reset signal for the latch. When the reset signal changes from the second logic level (1) to the first logic level (0), the MOS transistor $M_{23}$ will turn on and reset the input of the latch formed by the inverters u26 and u27 to the second logic level (1).

The output of the latch formed by the inverters u26 and u27 is the latched measurement signal $a_n$. When the input of the latch formed by the inverters u26 and u27 is reset to the first logic level (0).

When the first timing signal CK1 changes from the first logic level (0) to the second logic (1) and the input delay clock FCKI is at the first logic level (0), the output of the inverter u22 will change to the first logic level (0) and the output of the NAND gate u23 will remain at the second logic level (1).

When the first timing signal CK1 is at the first logic level (0), the output of the inverter u22 is at the second logic level (1). If the input delay clock FCKI changes from the first logic level (0) to the second logic level (1), output of the NAND gate u23 will change from the second logic level (1) to the first logic level (0). The output of the inverter u24 will thus change at a time that is equivalent to the delay of the NAND gate u23 and the delay output FCKO from the inverter u24 will change from the first logic state (0) to the second logic state (1). After the pulse width time of the first timing clock CK1 the delay output FCKO of the inverter u24 will return to the first logic level (0).

When the first timing clock CK1 is at the first logic level (0) and the input delay clock FCKI is propagating, the pass gate formed by the MOS transistors $M_{19}$, and $M_{21}$, and the pass gate formed by the MOS transistors $M_{20}$ and $M_{22}$ will be disabled and will not effect the latch formed by the inverters u26 and u27. At the arrival of the transition of the first timing clock CK1 from a the first logic level (0) to the second logic level (1), the output of latch formed by the inverters u26 and u27 will set and the latched measurement signal $a_n$ will change to the second logic level (1). Upon the arrival of the transition of the first timing clock CK1 from a the first logic level (0) to the second logic level (1), the MOS transistors $M_{19}$ and $M_{21}$, are disabled and the MOS transistors $M_{20}$ and $M_{22}$ are enabled, such that the propagation of the delay output FCKO will not be transmitted to the inverter u25. This will ensure the correct timing of the latching operation.

After sufficient delay, the delay input FCKI will begin to overlap the arrival of the first timing clock CK1. The will create a short pulse at the output of the inverter u24 that will transition from the first logic level (0) to the second logic level (1) and return after a small period of time (on the order of one gate delay) to the first logic level (0). This pulse will occur when the pass gate formed by the MOS transistors $M_{19}$ and $M_{21}$, and the pass gate formed by the MOS transistors $M_{20}$ and $M_{22}$ are active and the pulse will be the input to the inverter u25. The pulse will be inverted and place the first logic level (0) at the input of the latch formed by the inverters u26 and u27. This will set the output of the latch formed by the inverters u26 and u27 to the second logic level (1). The latch will remain at the second logic level (1) until it is reset by the reset signal.

When the latched measurement signal an is set to the second logic level (1), the measurement of the difference $\tau_1$ between the period $\tau_{ck}$ of the external clock XCLK and the sum of the delay of the internal buffer IBUF and the delay of the delay monitor circuit DMC will be determined.

Returning to FIG. 4, the first timing clock CK1 is the input to the first multiple delay element DE2 of the multiple phase delay array MPDA. The multiple phase delay array MPDA has a plurality of serially cascaded multiple delay elements $DE2_1$, $DE2_2$, ..., $DE2_{n-1}$, $DE2_n$. Each delay output has multiple outputs $b_0$, $b_1$, ..., $b_{n-1}$, $b_n$ and $c_0$, $c_1$, ..., $c_{n-1}$, $c_n$ that are delayed versions of the first timing clock CK1. The delays of the output have the correct timing for each of the multiple phases of the output SCLK and DCLK.

Figure 10:
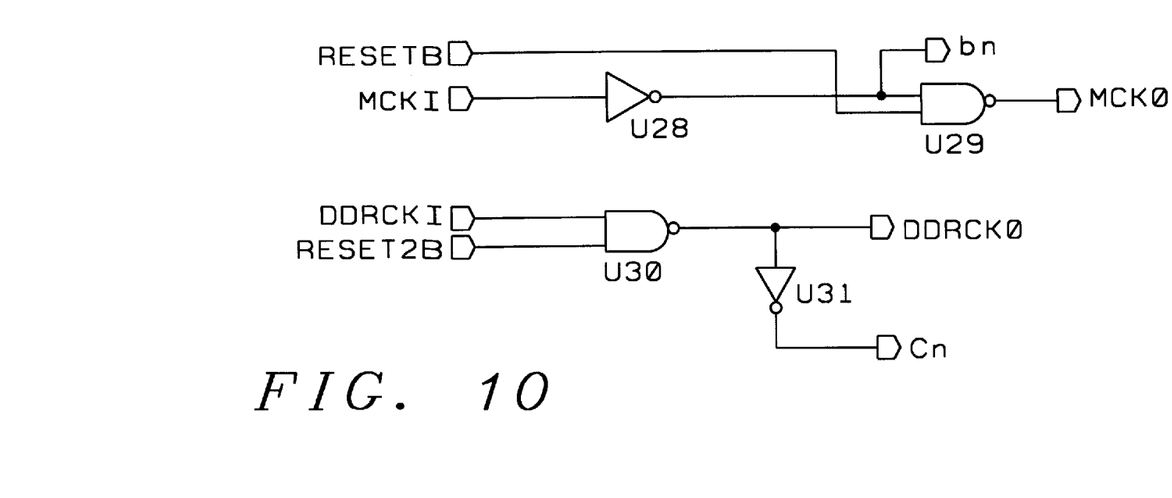
FIG. 10 is a schematic diagram of a dual delay element of a multiple delay array of a latched type clock synchronizer circuit of this invention.

FIG. 10 illustrates a multiple delay element $DE2_n$ to generate two outputs $b_n$ and $c_n$. The first phase input MCKI is connected to the inverter u28 is the first input to the NAND gate u29. The first reset signal RESETB is the second input to the NAND gate u29. The output of the NAND u29 will be the first phase output MCKO of the delay element.

The first phase input MCKI of the delay element will be connected to the first phase output MCKO of each preceding delay element.

The second phase input DDRCKI is connected to the first input of the NAND gate u30. The second input of the NAND gate u30 is the second reset signal RESET2B. The output of the NAND gate u30 is the input to the inverter u31, and the output of the inverter u31 is the delay element output $c_n$.

The output of the NAND gate u30 forms the second phase output DDRCKO and will be the second phase input DDRCKI for each succeeding delay element. The first delay element $DE2_1$, of FIG. 4 will have the first phase input MCKI and the second phase input DDRCKI connected to the first timing clock CK1.

The delay of the path form the first phase input MCKI to the first phase output MCKO will be the delay of the inverter u28 and the NAND gate u29, while the delay of the path from the second phase input DDRCKI to the second phase output DDRCKO will be the delay of the NAND gate u30. It will be apparent to those skilled in the art that other combinations of gate delay can create other phase relationships to create additional phases.

Referring back to FIG. 4, the latched measurement signal $a_0, a_2, \ldots, a_{n-1}, a_n$ and the first phase outputs $b_0, b_1, \ldots, b_{n-1}, b_n$ are respectively the first and second inputs of the NAND gates u100, u101, u102, and u103 of the first phase generator φ GEN1. The outputs of the NAND gates u100, u101, u102, and u103 are the inputs to the OR gate u109. The output of the OR gate u109 is the third timing clock CK3.

The OR gate u109 will generally be implemented as, what is termed in the art, a "wired OR".

The latched measurement signal $a_0, a_2, \ldots, a_{n-1}, a_n$ and the second phase outputs $c_0, c_1, \ldots, c_{n-1}, c_n$ are also respectively the first and second inputs of the NAND gates u104, u105, u106, and u107 of the second phase generator φ GEN2. The outputs of the NAND gates u104, u105, u106, and u107 are connected to the OR gate u110. As with the OR gate u109, the OR gate u110 can be implemented as a "wired OR". The output of the OR gate u110 will be the timing clock CK4.

For additional phases, additional phase generators will be created having identical structure to that of the first phase generator φ GEN1 and the second phase generator φ GEN2. The latched measurement signal $a_0, a_2, \ldots, a_{n-1}, a_n$ and additional phase outputs from the multiple phase delay array MPDA will be logically combined as described for the first phase generator φ GEN1 and the second phase generator φ GEN2 to create additional timing clocks.

The third timing clock CK3 and the fourth timing clock CK4 will be the inputs respectively to the first and second internal buffers INTBUFS and INTBUFD. The first and second internal buffers INTBUFS and INTBUFD will amplify, shape, delay, and buffer respectively the third and fourth timing clocks CK3 and CK4. The first and second internal buffers INTBUFS and INTBUFD will then transmit respectively the first and second phases of internal clock SCLK and DCLK to the internal circuits of the SDRAM.

Figure 11:
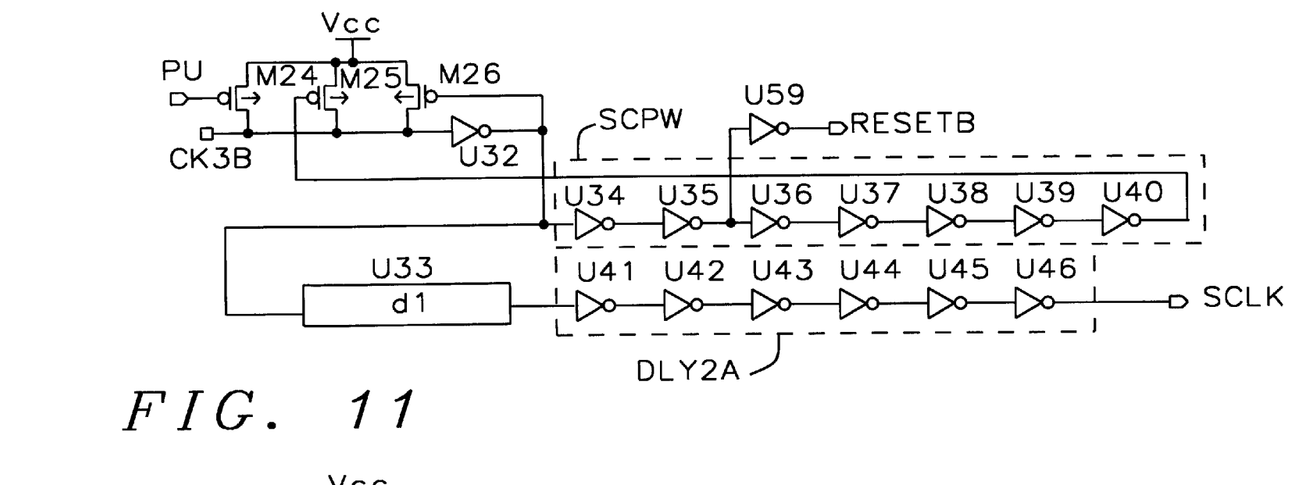
FIG. 11 is a schematic diagram of a first internal buffer circuit of a latched type clock synchronizer circuit of this invention.
Figure 12:
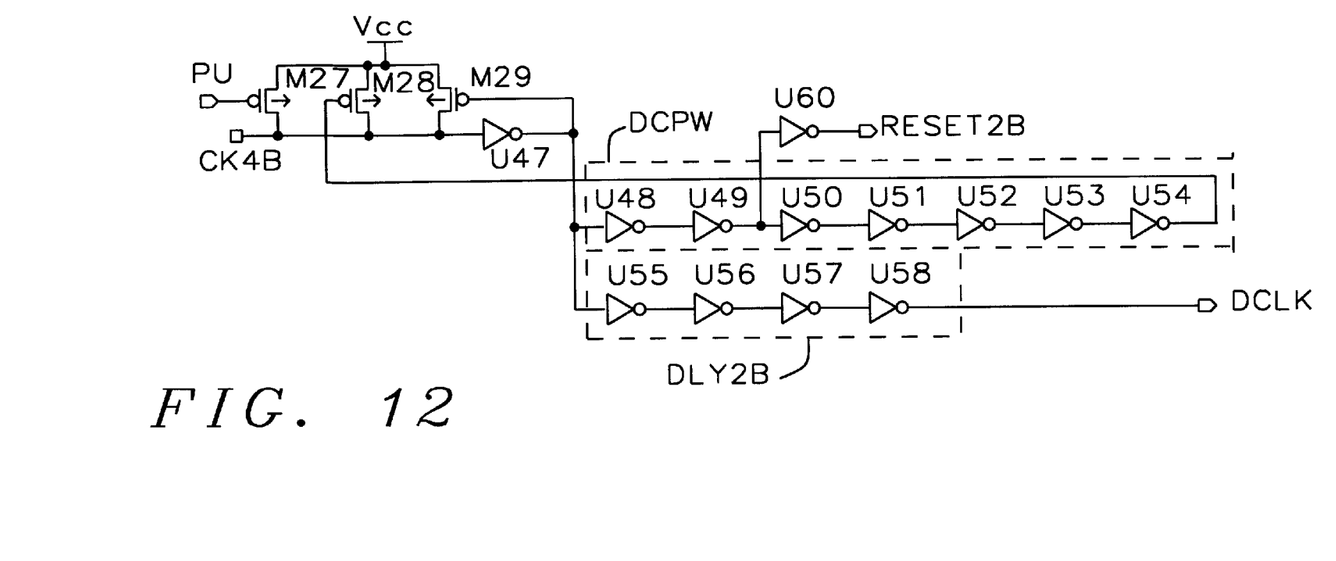
FIG. 12 is a schematic diagram of a second internal buffer circuit of a latched type clock synchronizer circuit of this invention.

Refer now to FIGS. 11 and 12 to understand the operation of the first and second internal buffers INTBUFS and INTBUFD. The third timing clock is connected to the sources of the MOS transistors $M_{24}$, $M_{25}$, and $M_{26}$ and to the input of the inverter u32. The gate of the MOS transistor M24 is connected to a power system control signal PU. The power system control signal PU will be made valid when the power supply voltage source $V_{cc}$ for the SDRAM is activated.

The output of the inverter u32 is connected to the input of the delay block u33. The delay block u33 has a delay factor of d1 and will operate as described in FIG. 7. The output of the delay block u33 will be the input to the delay chain DLY2A. The delay chain DLY2A will be formed of the cascaded inverters u41, u42, u43, u44, u45, and u46. The inverter u32 and the delay chain DLY2A will have the delay factor d2.

The output of the inverter u32 is also the input of the first clock phase pulse width circuit SCPW. The first clock phase pulse width circuit SCPW is formed by the cascaded inverters u34, u35, u36, u37, u38, u39 and u40. The output of the first clock phase pulse width circuit SCPW is connected to the gate of the MOS transistor $M_{25}$. The pulse width of the first phase of the internal clock will be determined by the cumulative delay of the cascaded inverters u34, u35, u36, u37, u38, u39 and u40.

The output of the inverter u35 is the input of the inverter u59. The output of the inverter u59 forms the first reset signal RESETB. The first reset signal RESETB will reset the latch formed of the inverters u26 and u27 of FIG. 9. Additionally the first reset signal RESETB is attached to the second input of the NAND gate u29 of FIG. 10. The first reset signal RESETB, when asserted, will cease the propagation of the first phase input MCKI through the multiple delay element $DE2_n$ of FIG. 10. This will initialize the multiple delay element $DE2_n$ for subsequent cycles of the first phase input MCKI.

The output of the inverter u47 is additionally attached to the gate of the MOS transistor $M_{26}$. The inverter u32 and the MOS transistor $M_{26}$ act as a pull up circuit. When the third timing clock is at the second logic level (1), the inverter u32 will be at the first logic level (0) and the MOS transistor $M_{26}$ will be activated bringing the third timing signal to the level of the power supply voltage source $V_{cc}$. If the circuitry that provides the third timing clock CK3 is a "wired OR", this action is necessary to provide the second logic level (1).

In FIG. 12, the fourth timing clock CK4 is connected to the sources of the MOS transistors $M_{27}$, $M_{28}$, and $M_{29}$ and to the input of the inverter u47. The output of the inverter u47 is the input of the delay chain DLY2B. The delay chain DLY2B is comprised of the cascaded inverters u55, u56, u57, and u58. The output of the delay chain DLY2B is the second phase of the internal clock DCLK. The delay of the inverter u47 and the delay chain DLY2B will be the delay factor d2/2 and will be determined by the cumulative delays of the inverter u47 and the inverters u55, u56, u57, and u58.

The MOS transistor $M_{27}$ has its gate connected to the power supply system control signal PU. The operation of the MOS transistor $M_{27}$ will be as described above for the MOS transistor $M_{24}$.

The output of the inverter u47 will be the input of the second phase clock pulse width circuit DCPW. The second phase clock pulse width circuit DCPW will be composed of the cascaded inverters u48, u49, u50, u51, u52, u53 and u54. The output of the second phase clock pulse width circuit DCPW is connected to the gate of the MOS transistor $M_{25}$. The operation of the of the second phase clock pulse width circuit DCPW is the same as that described above for the of the first phase clock pulse width circuit SCPW with the pulse width of the second phase of the internal clock being determined by the cumulative delay of the inverters u48, u49, u50, u51, u52, u53 and u54.

The output of the inverter u49 is the input of the inverter u60. The output of the inverter u60 is the second reset signal RESET2B. The second reset signal RESET2B is connected to the second input of the NAND gate u30 of FIG. 10. The second reset signal RESET2B, when asserted, will cease the propagation of the second phase input DDRCKI through the multiple phase delay element $DE2_n$ of FIG. 10. This will also initialize the multiple phase delay element $DE2_n$ for subsequent cycles of the second phase input DDRCKI.

The output of the inverter u47 is connected to the gate of the MOS transistor $M_{29}$. The inverter u47 and the MOS transistor $M_{29}$ will operate as a pull up circuit and will operate as described above for the inverter u32 and the MOS transistor $M_{26}$.

The structure for additional internal buffers to provide other phases for the internal clock will have the same structure as shown for the first and second internal buffers of FIGS. 11 and 12. The necessary delay will be accomplished by adjusting the number of inverters in the delay chains of the cascaded inverters.

Figure 13:
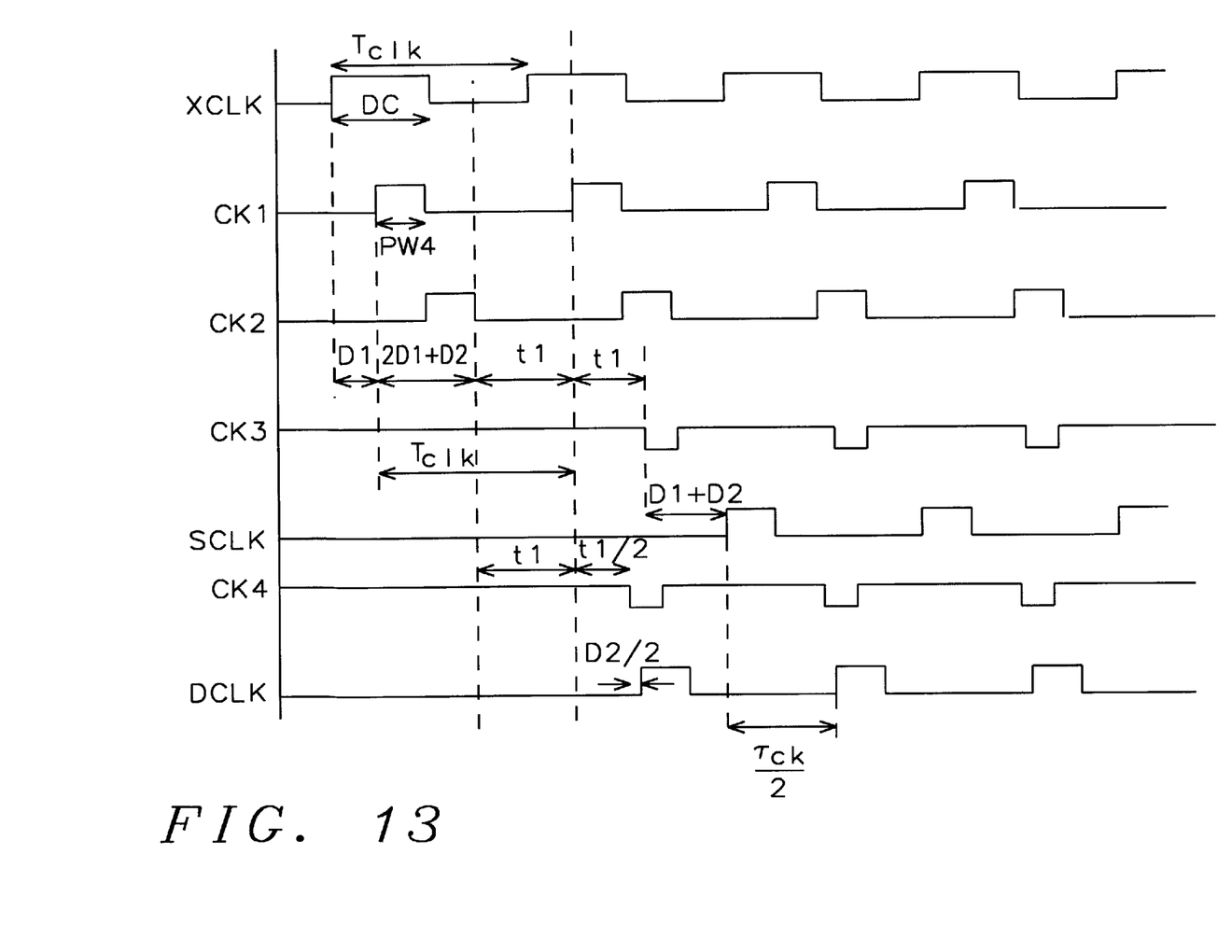
FIG. 13 is a timing diagram of the process to perform a latched type synchronization of multiple phases of an internal clock signal with an external clock signal of this invention.

Refer now to FIG. 13 for a review of the process necessary to generate multiple phase internal clocks that are synchronized to an external clock XCLK. The external clock XCLK has a period of $\tau_{ck}$. The duty cycle dc of the external clock XCLK is generally not defined in the industry specifications for SDRAM's.

The external clock XCLK is delayed by a delay factor d1 to form the first timing clock CK1. The first timing clock CK1 will be shaped to have a pulse width pw. The second timing clock CK2 will be delayed such that its trailing edge is delayed from the leading edge of the first timing clock CK1 by a factor that is the 2d1+d2. Where d2 is a second delay factor. The time difference factor $\tau_1$ from the falling edge of the second timing clock CK2 to the rising edge of the second pulse of the first timing clock CK1 will be determined. The first timing clock CK1 will be additionally delayed by this time difference factor $\tau_1$ and inverted to form the third timing clock CK3. The third timing clock CK3 will be delayed by a factor d1+d2, then shaped, buffered, and amplified for transmission as the first phase SCLK of the internal clock. The first phase SCLK of the internal clock will be aligned with the external clock XCLK.

Likewise, the first timing clock CK1 will be delayed by a delay factor $\tau_1/2$ and inverted to create the fourth timing clock CK4. The fourth timing clock CK4 will be delayed by the delay factor d2/2, then shaped, buffered and amplified for transmission as the second phase DCLK. The delay factor $\tau_1/2$ and the delay factor d2/2 will allow the second phase DCLK of the internal clock to be 180° out of phase with the first phase SCLK of the internal clock, or the second phase DCLK will change from the first logic level (0) to the second logic level (1) at a time $\tau_{ck}/2$ from the rising edge of the external clock XCLK.

Other phase clocks of the internal clock can be developed by adjusting the delay factor for additional timing clocks for the first timing clock CK1 in relation to the timing factor $\tau_1$ and the delay between the additional timing clocks in relation to the delay from the third timing clock to the first phase SCLK of the internal clock.

This structure will allow multiple phases of the internal clock to be generated from a single external clock, while having the synchronization transpire within the first two clock cycles of the startup of the external clock XCLK.

While this invention has been particularly shown and described with reference to the preferred embodiments thereof, it will be understood by those skilled in the art that various changes in form and details may be made without departing from the spirit and scope of the invention.

The invention claimed is:

1. A latched type clock synchronizer circuit to provide multiple phases of an internal clock for an integrated circuit that is synchronized to an external system clock, such that said internal clock has minimal skew with said external system clock and the multiple phases are aligned, comprising a) an input buffer circuit to receive, buffer, and amplify said external input clock to create a first timing clock;

b) a delay monitor circuit connected to the input buffer to delay the first timing clock by a first delay factor to create a second timing clock;

c) a delay measurement latch array connected to the input buffer circuit and the delay monitor circuit to create a latched measurement signal indicating a period of time between a second pulse of the first timing clock and a first pulse of the second timing clock;

d) a multiple delay array connected to the input buffer to receive the first timing signal to create multiple pluralities of incrementally delayed timing clocks;

e) a plurality of phase generators to create a plurality of third timing clocks whereby each phase generator is connected to the delay measurement latch array to receive the latched measurement signal and to the multiple delay array to receive one of the plurality of incrementally delay timing clocks, such that the latched measurement signal will select one of the incrementally delayed timing clocks to create the third timing clock; and f) a plurality of internal buffers whereby each internal buffer is connected to one of the phase generators to receive one of the third timing clocks, shape said third timing clock to create one of the multiple phases of the internal clocks and to buffer, amplify and transmit said phase of the internal clock to said integrated circuit, whereby said internal buffer has a second delay time to synchronize said phase with said external system clock.

2. The latched type clock synchronizer circuit of claim 1 wherein said integrated circuit is a synchronous dynamic random access memory and said internal clock will control a transfer of digital data to and from said synchronous dynamic random access memory.

3. The latched type clock synchronizer circuit of claim 1 wherein said delay factor is twice the first delay time plus the second delay time.

4. The latched type clock synchronizer circuit of claim 1 wherein the delay measurement latch array comprises a first latched delay element and a plurality of serially cascaded delay elements whereby each latched delay element includes:

a) a first clock input connected to the input buffer to receive the first timing clock;

b) a second clock input such that said second input of the first latched delay element is connected to the delay monitor circuit to receive the second timing clock;

c) a delay gate connected to the second input to delay the second timing clock;

d) an alignment checking latch that will be set when the second pulse of the first timing clock is aligned with the first pulse of the delayed second clock; and e) a delay output connected to the delay gate to transmit the delayed second clock to the second input of a following latched delay element of the plurality of cascaded latched delay elements.

5. The latched type clock synchronizer circuit of claim 1 wherein the multiple delay array comprises multiple first delay elements and multiple pluralities of serially connected delay elements with each plurality connected to one of the first delay elements, whereby each delay element comprises:

a) a delay element input such that said delay element input of each first delay element is connected to the input buffer to receive the first timing clock;

b) a second delay gate connected to the delay element input to delay the first timing clock;

c) a first delay element output connected to the second delay gate to transmit a delay first timing clock to subsequent delay elements; and d) a delay tap output to transmit one of the delayed timing clocks.

6. The latched type clock synchronizer circuit of claim 1 wherein each of the plurality of phase generators comprises a plurality of logic gates wherein each logic gate will logically combine the latched measurement signal with one of the multiple pluralities of delay timing signals to create one of the third timing clocks.

7. A synchronous dynamic random access memory to retain digital data comprising:
   a) a plurality of memory banks in which to retain said digital data;
   b) an address control buffer connected to a system address bus to receive an address and to the plurality of memory banks to select a location of said digital data within said plurality of memory banks;
   c) a command decoder connected to a command bus to receive and interpret system commands for said synchronous dynamic random access memory and connected to the plurality of memory banks to transfer said commands to said memory banks;
   d) a data control circuit connected to the plurality of memory banks to control a flow of said digital data;
   e) a data input/output buffer connected to a system data bus and to said data control circuit to receive and transmit said digital data from said system data bus to said data control circuit; and
   f) a clock buffer circuit connected to a system input clock to create a plurality of internal clocking signals including multiple phases of a synchronized internal clock, comprising:
      an input buffer circuit to receive, buffer, and amplify said external input clock to create a first timing clock,
      a delay monitor circuit connected to the input buffer to delay the first timing clock by a first delay factor to create a second timing clock,
      a delay measurement latch array connected to the input buffer circuit and the delay monitor circuit to create a latched measurement signal indicating a period of time between a second pulse of the first timing clock and a first pulse of the second timing clock,
      a multiple delay array connected to the input buffer to receive the first timing signal to create multiple pluralities of incrementally delayed timing clocks,
      a plurality of phase generators to create a plurality of third timing clocks whereby each phase generator is connected to the delay measurement latch array to receive the latched measurement signal and to the multiple delay array to receive one of the plurality of incrementally delay timing clocks, such that the latched measurement signal will select one of the incrementally delayed timing clocks to create the third timing clock, and
      a plurality of internal buffers whereby each internal buffer is connected to one of the phase generators to receive one of the third timing clocks, shape said third timing clock to create one of the multiple phases of the internal clocks and to buffer, amplify and transmit said phase of the internal clock to said integrated circuit, whereby said internal buffer has a second delay time to synchronize said phase with said external system clock.

8. The synchronous dynamic random access memory of claim 7 wherein the delay measurement latch array comprises a first latched delay element and a plurality of serially cascaded delay elements whereby each latched delay element includes:

a) a first clock input connected to the input buffer to receive the first timing clock;

b) a second clock input such that said second input of the first latched delay element is connected to the delay monitor circuit to receive the second timing clock;

c) a delay gate connected to the second input to delay the second timing clock;

d) an alignment checking latch that will be set when the second pulse of the first timing clock is aligned with the first pulse of the delayed second clock; and e) a delay output connected to the delay gate to transmit the delayed second clock to the second input of a following latched delay element of the plurality of cascaded latched delay elements.

9. The synchronous dynamic random access memory of claim 7 wherein the multiple delay array comprises multiple first delay elements and multiple pluralities of serially connected delay elements with each plurality connected to one of the first delay elements, whereby each delay element comprises:
   a) a delay element input such that said delay element input of each first delay element is connected to the input buffer to receive the first timing clock;
   b) a second delay gate connected to the delay element input to delay the first timing clock;
   c) a first delay element output connected to the second delay gate to transmit a delay first timing clock to subsequent delay elements; and
   d) a delay tap output to transmit one of the delayed timing clocks.

10. The synchronous dynamic random access memory of claim 7 wherein each of the plurality of phase generators comprises a plurality of logic gates wherein each logic gate will logically combine the latched measurement signal with one of the multiple pluralities of delay timing signals to create one of the third timing clocks.

11. A method to create multiple phases of internal clocks for an integrated circuit having synchronized to an external system clock, comprising the steps of:
   a) receiving and buffering said external clock;
   b) creating a first timing clock having a first pulse width and delayed from said external clock by a first delay factor;
   c) creating a second timing clock having a second pulse width and delayed from said first timing clock by a second delay factor;
   d) generating a latched measurement signal indicating an alignment time that the difference in time from the first timing clock and the second timing clock;
   e) creating a multiple plurality of incrementally delayed timing signals;
   f) logically combining said latched measurement signal with said multiple pluralities of incrementally delayed timing signals to create a plurality of third timing clocks;
   g) shaping, amplifying, and buffering said plurality of third timing clocks to create the multiple phases of internal clocks that are aligned and synchronized with said external clock; and
   h) transmitting said multiple phases of internal clocks within said integrated circuit.

* * * * *